United States Patent
Karanam et al.

(10) Patent No.: US 11,127,158 B2
(45) Date of Patent: Sep. 21, 2021

(54) IMAGE INDEXING AND RETRIEVAL USING LOCAL IMAGE PATCHES FOR OBJECT THREE-DIMENSIONAL POSE ESTIMATION

(71) Applicant: Siemens Mobility GmbH, Munich (DE)

(72) Inventors: Srikrishna Karanam, Plainsboro, NJ (US); Ziyan Wu, Princeton, NJ (US); Shanhui Sun, Princeton, NJ (US); Oliver Lehmann, Schoeneiche bei Berlin (DE); Stefan Kluckner, Berlin (DE); Terrence Chen, Princeton, NJ (US); Jan Ernst, Princeton, NJ (US)

(73) Assignee: Siemens Mobility GmbH, Munich (DE)

( * ) Notice: Subject to any disclaimer, the term of this patent is extended or adjusted under 35 U.S.C. 154(b) by 115 days.

(21) Appl. No.: 16/487,219

(22) PCT Filed: Feb. 23, 2017

(86) PCT No.: PCT/US2017/019005
§ 371 (c)(1),
(2) Date: Aug. 20, 2019

(87) PCT Pub. No.: WO2018/156127
PCT Pub. Date: Aug. 30, 2018

(65) Prior Publication Data
US 2020/0013189 A1    Jan. 9, 2020

(51) Int. Cl.
*G06K 9/00* (2006.01)
*G06T 7/73* (2017.01)
(Continued)

(52) U.S. Cl.
CPC .............. *G06T 7/74* (2017.01); *G06F 30/00* (2020.01); *G06N 3/0454* (2013.01); *G06N 3/08* (2013.01);
(Continued)

(58) Field of Classification Search
CPC .......... G06T 7/74; G06T 7/136; G06T 7/529; G06T 2200/04; G06T 2207/10028; G06F 30/00; G06N 3/0454; G06N 3/08
See application file for complete search history.

(56) References Cited

U.S. PATENT DOCUMENTS 8,031,906 B2    10/2011 Fujimura et al.
2015/0186458 A1*    7/2015 Gupta ............... G06F 16/90335
707/769

(Continued)

OTHER PUBLICATIONS

David Demirdjian and Raquel Urtasun "Patch-based pose inference with a mixture of density estimators" (Year: 2007).*
Mathieu Aubry, "seeing 3D chairs, exemplar part based 2D-3D alignment using a large dataset of CAD models" (Year: 2014).*
International Search Report dated Oct. 27, 2017; International Patent Application No. PCT/US2017/019005; Filing Date: Feb. 23, 2017; 26 pages.

(Continued)

*Primary Examiner* — Dhaval V Patel (57) ABSTRACT

The present embodiments relate to automatically estimating a three-dimensional pose of an object from an image captured using a camera with a structured light sensor. By way of introduction, the present embodiments described below include apparatuses and methods for training a system for and estimating a pose of an object from a test image. Training and test images are sampled to generate local image patches. Features are extracted from the local image patches to generate feature databased used to estimate nearest neighbor poses for each local image patch. The closest nearest neighbor pose to the test image is selected as the estimated three-dimensional pose.

15 Claims, 7 Drawing Sheets

(51) Int. Cl.
*G06T 7/136* (2017.01)
*G06T 7/529* (2017.01)
*G06F 30/00* (2020.01)
*G06N 3/04* (2006.01)
*G06N 3/08* (2006.01)

(52) U.S. Cl.
CPC ............ *G06T 7/136* (2017.01); *G06T 7/529* (2017.01); *G06T 2200/04* (2013.01); *G06T 2207/10028* (2013.01)

(56) References Cited

U.S. PATENT DOCUMENTS

| | | | |
|---|---|---|---|
| 2016/0163058 A1* | 6/2016 | Wei | G06T 7/194 382/171 |
| 2016/0253807 A1 | 9/2016 | Jones et al. | |
| 2016/0275686 A1* | 9/2016 | Zach | G06K 9/6201 |

OTHER PUBLICATIONS

Mori Greg et al: "Pose Embeddings: A Deep Architecture for Learning to Match Human Poses", pp. 1-9, XP055376897, gefunden im Internet: URL:https://arxiv.org/pdf/1507.00302.pdf; [gefunden am May 30, 2017] the whole document.

Krull Alexander et al: "Learning Analysis-by-Synthesis for 60 Pose Estimation in RGB-D Images", 2015 IEEE International Conference on Computer Vision (ICCV), IEEE, Dec. 7, 2015 (Dec. 7, 2015), pp. 954-962, XP032866420.

Paul Wohlhart et al: "Learning descriptors for object recognition and 3D pose estimation" Apr. 13, 2015 (Apr. 13, 2015) XP055383098 / Apr. 13, 2015.

Examination Report dated Jun. 1, 20216; Application No. 201917033841; 6 pages.

* cited by examiner

IMAGE INDEXING AND RETRIEVAL USING LOCAL IMAGE PATCHES FOR OBJECT THREE-DIMENSIONAL POSE ESTIMATION

This application is a national phase filing under 35 U.S.C. § 371 of International Patent Application No. PCT/US2017/019005, filed Feb. 23, 2017, which is incorporated herein by reference in its entirety.

BACKGROUND

Three-dimensional pose estimation has many useful applications, such as estimating a pose of a complex machine for identifying a component or replacement part of the machine. For example, a replacement part for a high speed train may be identified by capturing an image of the part. Using depth images, the pose of the train, and ultimately the part needing replacement, is identified. By identifying the part using the estimated pose, a replacement part may be ordered without needing or providing a part number or part description.

A typical approach to estimating a three-dimensional pose of a test object involves constructing a database with depth images of known poses of the object. The database is then searched, in a feature space, for the pose of the test object. This approach employs global image descriptors learned using machine learning. Depth images captured by structured light sensors are typically cluttered with noise and a spurious background. Noise sources complicate the task of estimating the pose of the test image from the search of the database. For example, using a global descriptor derived from features extracted from a depth image with the noise and background clutter, the resulting global image descriptors often do not accurately represent the pose of the object.

SUMMARY

The present embodiments relate to automatically estimating a three-dimensional pose of an object from an image captured using a camera with a structured light sensor or other depth camera. By way of introduction, the present embodiments described below include apparatuses and methods for training a system for and estimating a pose of an object from a test image. Images are sampled to generate local image patches. Features are extracted from the local image patches to generate feature databased used to estimate a nearest pose to the pose in each local image patch. For estimating pose from a test image, the closest nearest neighbor pose to the image is selected as the estimated three-dimensional pose.

In a first aspect, a method for estimating a three-dimensional pose of an object is provided. The method includes receiving a depth image of the object, sampling the depth image to generate a plurality of image patches of the depth image and extracting features from each of the plurality of image patches using a trained convolutional neural network. The method also includes searching a plurality of image patch feature databases for a plurality of nearest neighbor poses, each pose for one of the plurality of image patches, and estimating the three-dimensional pose of the object based on the plurality of nearest neighbor poses.

In a second aspect, another method for estimating a three-dimensional pose of an object is provided. The method includes receiving a plurality of depth images, sampling the plurality of depth images to generate a plurality of image patches for each of the plurality of depth images and training a convolutional neural network to learn features and extract values for the features from each of the plurality of depth images and each of the plurality of image patches. The method also includes generating an image feature database corresponding to the plurality of depth images and generating a plurality of image patch databases, each database corresponding to a different image patch of the of the plurality of depth images.

In a third aspect, a system for estimating a three-dimensional pose of an object is provided. The system includes a memory configured to store feature databases for image patches, the feature databases generated using training data. The system also includes a processor configured to receive a depth image of the object captured by a sensor of a mobile device and generate image patches from the depth image. The processor is also configured to identify a nearest neighbor pose for each of the generated image patches from the stored feature databases and to estimate a three-dimensional pose of the object from the identified nearest neighbor poses.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION

A technique is disclosed for automatically estimating the three-dimensional pose of an object from an image captured using a camera with a structured light sensor or other depth camera. Pose estimation may be used in various visual analytics applications involving image search and retrieval. To more accurately estimate a three-dimensional pose of an object, a search is performed in a feature space that is less influenced by noise or background clutter.

To mitigate the influence of noise and background clutter, local image information is exploited. For training, local image patches for each training image are used. Instead of utilizing a single feature database indexing known poses from each of the training images, a feature database for each local image patch is generated indexing known poses from the local image patches generated from training images. For example, local feature databases index local image information for the same poses from the training images. When the trained system is provided a test image, image patches are sampled from the test image and patch-based features are extracted. A search is then performed using the patch-based features in the corresponding local feature database for the respective image patch. A patch-based pose is assigned to each image patch, and a best pose is estimated across all searches performed for the object in the test image. As such, an end-to-end solution is provided for training a system to and for estimating a three-dimensional pose of an object from depth images captured using structured light sensors or other depth cameras.

Figure 1:
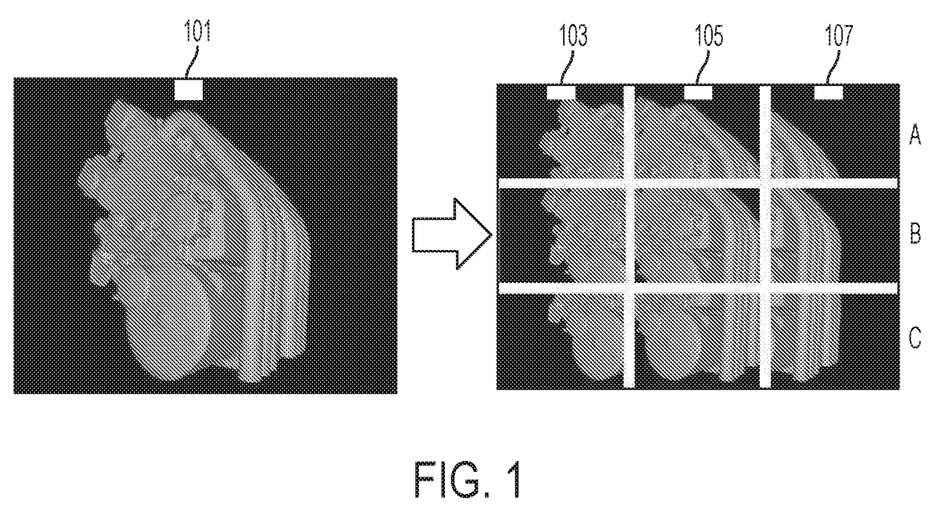
FIG. 1 illustrates an example of constructing image patches from a depth image.

For both training and pose estimation, image patches are generated. For example, FIG. 1 illustrates an example of generating image patches from an input depth image. Depth image 101 is sampled to generate image patches 103A-103C, 105A-105C and 107A-107C. Depth image 101 may be one of a plurality of training images or a test image. As depicted in FIG. 1, depth image 101 is uniformly sampled into local image patches of the same size and resolution. Alternatively, depth image 101 may be non-uniformly sampled. For example, depth image 101 may be sampling generating uniform image patches representing the perimeter of the depth image (e.g., patches 103A-103C, 105A, 105B and 107A-107C) and generating a larger, smaller, the same sized, non-uniform image patch representing the center of the depth image (e.g., patch 105B), with greater, lessor or the same resolution. Additional, different or fewer uniform or non-uniform image patches may be generated.

Features are extracted from each image patch using a machine learning artificial agent (e.g. through deep learning using a convolutional neural network). For example, a convolutional neural network is trained using labeled data from the depth images. The training learns what features for a given patch distinguish poses and a classifier for estimating a probability of the pose. The input is the image patch, including the color or gray scale values for each pixel and the depth from the camera for each pixel. Using the extracted features, the feature space is searched to identify nearest neighbor poses of each patch in a database. Because the feature databases are generated using training data representing discrete poses and may not include the exact pose of the test image, the closest pose to the test images (i.e., the nearest neighbor pose) is identified for each image patch. Therefore, for each test image, a plurality of nearest neighbor poses is identified (e.g., one pose for each image patch) and a confidence score may be assigned to each pose. The pose that best fits the object in the test image is selected. In this way, each image patch "votes" for a particular pose by identifying a pose and the likelihood that the pose best fits the object in the test image.

Figure 2:
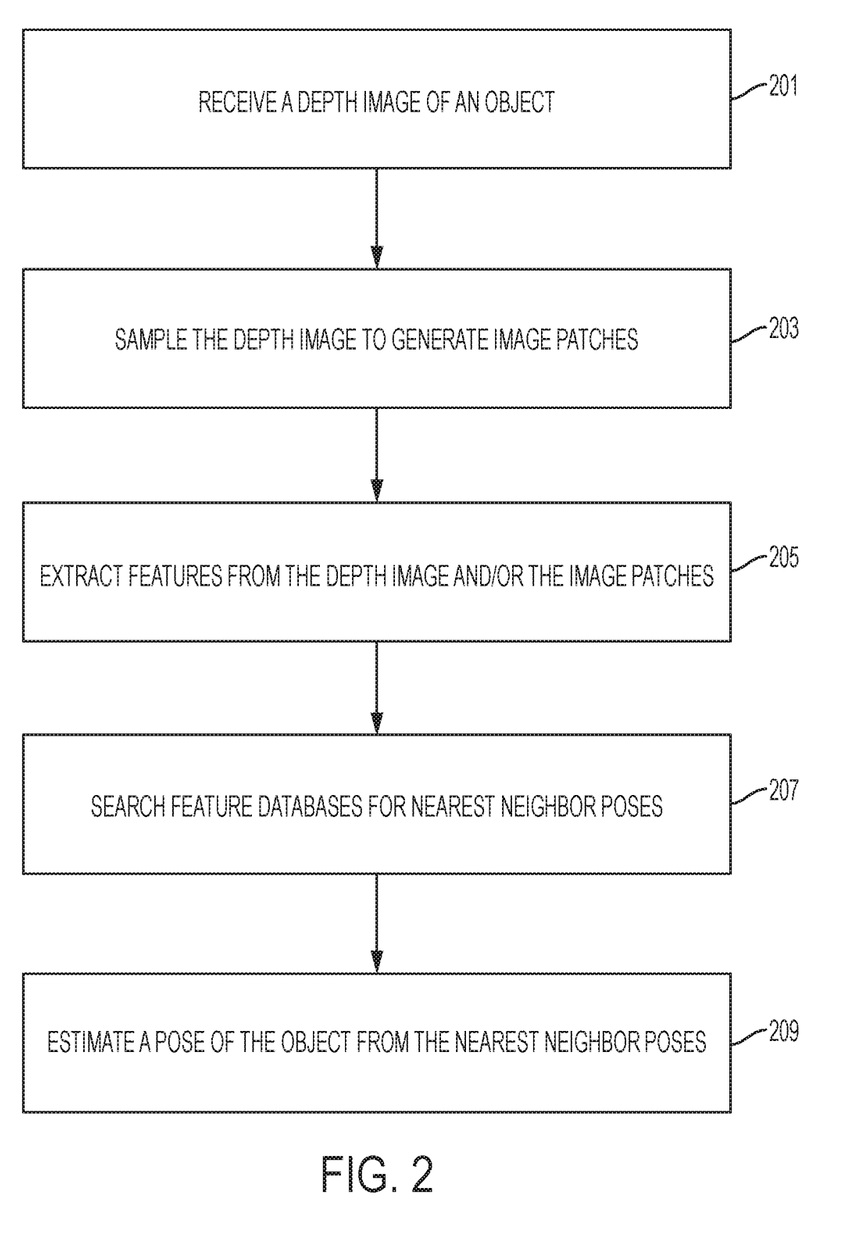
FIG. 2 illustrates a flowchart diagram of an embodiment of a method for estimating a three-dimensional pose of an object.

FIG. 2 illustrates a flowchart diagram of an embodiment of a method for estimating a three-dimensional pose of an object. The method is implemented by the system of FIG. 6 (discussed below), FIG. 7 (discussed below) and/or a different system. Additional, different or fewer acts may be provided. For example, one or more acts may be omitted, such as act 201, or one or more of acts 401, 403, 405 and 407 discussed below with respect to FIG. 4 may be included. The method is provided in the order shown. Other orders may be provided and/or acts may be repeated. Further, the acts may be performed concurrently as parallel acts. For example, multiple acts 205 may be performed concurrently to extract features from the depth image and/or multiple image patches at the same time.

At act 201, a depth image of the object is received. The depth image is captured using a three-dimensional scanner. For example, the three-dimensional scanner is a camera with a structured-light sensor, or a structured-light scanner. A structured-light sensor is a scanner that includes a camera and a projector. The projector projects structured light patterns that are captured by the camera. A multi-shot structured light sensor captures multiple images of a projected pattern on the object. The captured images of the pattern are used to generate the three-dimensional depth image of the object. For example, the depth image may be received as point cloud data. Each pixel is associated with a depth from the sensor. For example, red, green, blue+depth (RGB+D) data is provided.

Figure 3:
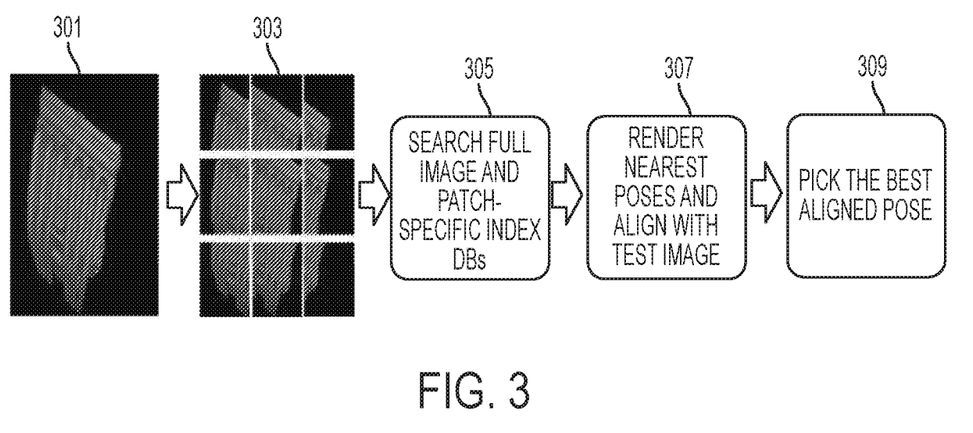
FIG. 3 illustrates an example of estimating a three-dimensional pose of an object from a test image.

FIG. 3 illustrates an example of estimating a three-dimensional pose of an object from a test image. Referring to FIG. 3, depth image 301 is received. In this example, a depth image 301 of an engine of a high speed train is received. The depth image 301 may be received from a mobile device, captured by a sensor of the mobile device (e.g., smart phone or tablet). Alternatively, the depth image 301 may be captured by a sensor of a computing system.

At act 203, the depth image is sampled to generate a plurality of image patches of the depth image. Referring to FIG. 3, depth image 301 is sampled to generate a plurality of image patches 303. The depth image may be uniformly or non-uniformly sampled. The image patches are generated in the same fashion as the training images were sampled from a plurality of training images during training (discussed below). The image patches provide local image and depth information for identifying the same or similar poses from image patches generated from the plurality of training images.

At act 205, features are extracted from each of the plurality of image patches. The features are extracted from each patch using a trained or learned convolutional neural network. Other machine learning algorithms or artificial agents may be used. The convolutional neural network is trained based on the annotated training images. For the convolutional neural network, the training identifies the distinguishing features. These deep-learnt features are then extracted from the image patches. Additionally, features may be extracted from the un-sampled depth image (e.g., the full-image, entire depth image). The features are extracted in the same fashion as or as learned using the training images and training image patches.

At act 207, feature databases are searched for nearest neighbor poses. For example, a plurality of image patch feature databases are searched to find a plurality of nearest neighbor poses for the plurality of image patches. A different nearest neighbor pose is found for each of the image patches using a respective feature database. To find the nearest neighbor poses, a different feature database is searched for each image patch.

Additionally, a nearest neighbor pose may be found for the un-sampled depth image (e.g., the full-image, entire depth image). A full-image feature database is searched for the un-sampled depth image.

Indexing in the databases provides a compact view representation enabling quick search using efficient metrics. For example, the feature databases may be searched by applying L1-norm or L2-norm metrics. Other metrics may be used.

Referring to FIG. 3, the nearest neighbor poses for each local image patch of the plurality of image patches 303 and a nearest neighbor pose for the full depth image 301 form a pool of possible poses. For each patch as well as the full image, nearest neighbors in the corresponding database are found. For example, referring back to FIG. 1, a database for patch 103A will be searched for features of patch 103A, a database for patch 103B will be searched for features of patch 103B, and so on through database 107C searched for features of patch 107C. A database for depth image 101 may also be searched for depth image 101. This results in a set of nearest neighbors in the feature space, with each nearest neighbor of this set indexing a certain pose.

A confidence score may be assigned to each of the nearest neighbor poses. For example, referring back to FIG. 1, image patch 107A has substantially more background than image patch 105B. As such, it is likely that that image patch 107A has substantially more noise or background clutter than image patch 105B. Using this information, a higher confidence score may be assigned to image patch 105B than 107A. Additional and different metrics may be used to assign a confidence score to the nearest neighbor patches. For example, a confidence score may be assigned based on the features extracted from the image patches.

At act 209, a three-dimensional pose of the object is estimated. The three-dimensional pose of the object is estimated based on the pool of nearest neighbor poses. For example, the three-dimensional pose of the object may be chosen based on the confidence score assigned to the each nearest neighbor pose. For example, a confidence score is assigned based on the number of features extracted from each patch, or a confidence score may be assigned based on the level of noise in the patch (e.g., due to a noisy background, etc.).

Other methodologies for estimating the three-dimensional pose of the object based on the pool of nearest neighbor poses may be used. For example, depth images corresponding to the clustered nearest neighbor poses may be rendered using a three-dimensional computer-aided design model. A refinement algorithm may be applied to each of the rendered images using the input test image as the source, resulting in refined poses corresponding to clustered nearest neighbor poses.

For example, referring to FIG. 3 at 307, the three-dimensional pose is estimated by rendering a depth image for each of the identified nearest neighbor poses and aligning the rendered depth images with the received depth image of the object.

At 307, a depth image for each of the identified nearest neighbor poses is rendered. The rendered depth image for the nearest neighbor poses will closely resemble the received depth image. Because the feature database includes a discrete number of poses, the nearest neighbor poses, and consequently the rendered images, may be slightly different than the pose from the received depth image. The rendered depth images are rendered using a three-dimensional model of the object (e.g., a three-dimensional computer-aided design (CAD) model). The three-dimensional model of the object may be the three-dimensional CAD model used to design the object, such as the engine of a high speed train depicted in depth image 301.

Further, at 307, the rendered depth images may be aligned with the received depth image 301. The rendered depth images representing the nearest neighbor poses may be refined prior to choosing the best pose. For example, aligning the rendered depth images may apply a mean shift algorithm and a refinement algorithm to each of the rendered depth images. A mean shift algorithm is applied to identify clusters in the feature space of the poses indexed by the pool of nearest neighbors. As such, local maxima in the feature space are determined for the nearest neighbor poses. Cluster centers may then be determined from the identified clusters in the feature space.

The cluster centers may then be refined using a refinement algorithm (e.g., an iterative closest point (ICP) algorithm). For example, using point clouds derived from the rendered depth images, a difference between the derived point clouds and the point cloud of the received depth image 301 may be minimized. As such, pose parameters from the rendered images that best describe the received depth image 301 are determined with respect to clustered nearest neighbor poses. As such, the poses in the rendered depth images are refined to more closely match the pose of the received depth image 301.

At 309, the best aligned pose is chosen. The best rendered and aligned depth image is the image that is closest to the received depth image. For example, difference images may be used. To utilize difference images, non-zero pixel-regions in the received depth image 301 may be identified. Difference images are generated, in the non-zero pixel-regions, between the received depth image 301 and the rendered depth images. For each difference image, the number of pixels that having a depth value less than a threshold are counted. The rendered depth image corresponding to the difference image having the fewest pixel counts below the threshold is chosen as the closest image to the received depth image 301. Other selection criterion may be used, such as Euclidian distance between point clouds.

Figure 4:
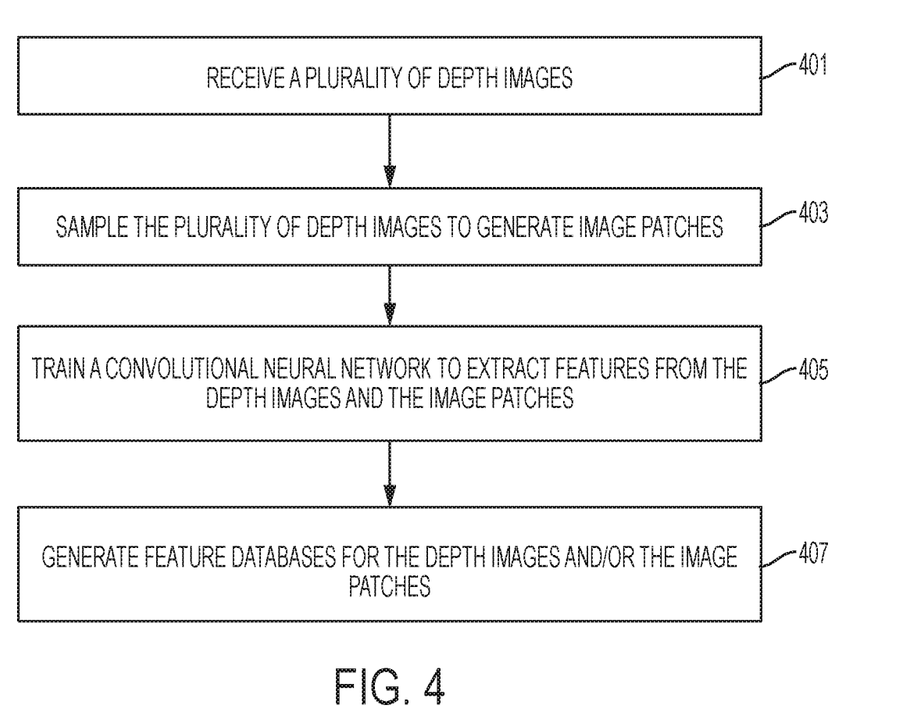
FIG. 4 illustrates a flowchart diagram of another embodiment of a method for estimating a three-dimensional pose of an object.

FIG. 4 illustrates a flowchart diagram of another embodiment of a method for estimating a three-dimensional pose of an object. The method of FIG. 4 represents deep learning features to resolve pose and values for the features of different poses. The databases of sets of deep-learnt features and corresponding poses for the patches and/or entire depth image are created.

The method is implemented by the system of FIG. 6 (discussed below), FIG. 7 (discussed below) and/or a different system. Additional, different or fewer acts may be provided. For example, one or more acts may be omitted, such as act 401, or one or more of acts 201, 203, 205, 207 and 209 discussed above with respect to FIG. 2 may be included. The method is provided in the order shown. Other orders may be provided and/or acts may be repeated. Further, the acts may be performed concurrently as parallel acts. For example, multiple acts 403 and 405 may be performed concurrently to extract features from the depth image and multiple image patches at the same time.

Figure 5:
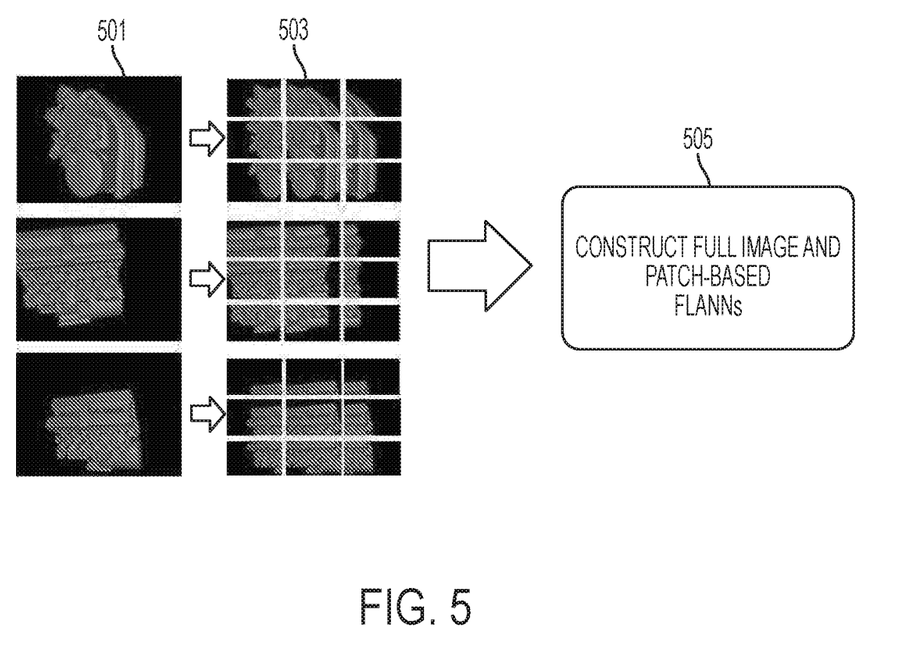
FIG. 5 illustrates an example of constructing feature databases using training images.

At act 401, a plurality of depth images are received. The plurality of depth images are annotated or labeled as training images. FIG. 5 illustrates an example of constructing feature databases using training images.

Referring to FIG. 5, training images 501 are received. Each training image of the training images 501 is for a different pose of the object. Any number of poses may be used. The training images are from CAD renderings of a model and/or are from actual depth camera captures of the object.

As depicted in FIG. 5, a system may be trained to estimate the pose of any object. In this example, the received training images 501 are depth images of different poses of an engine of a high speed train. The depth images are labeled for training (for clarity, the labels not depicted in FIG. 5). The training images 501 are generated or captured to provide image data in the same manner as a captured test image used for estimating a three-dimensional pose of the object.

At act 403, the plurality of depth images are sampled (i.e., segmented, separated, or divided) to generate a plurality of image patches for each the of depth images. The image patches provide local image information for training a system to identify the same or similar poses from image patches generated from a test image. The depth images may be uniformly or non-uniformly sampled to generate uniform or non-uniform image patches.

Referring to FIG. 5, training images 501 are sampled to form local image patches 503 for each training image. In this example, uniformly sampled local patches from each image are generated. The uniform image patches 503 provide local image information for each of the training images 501.

At act 405, a machine learning artificial agent, such as a convolutional neural network, is trained to extract features from each of the plurality of image patches of the depth images. Additionally, a convolutional neural network is also trained to extract features from each of the full depth images. In this training stage, the convolutional neural network is trained using labeled image data from the plurality of depth images and/or the plurality of image patches (for clarity, the labels not depicted in FIG. 5). Referring to FIG. 5, convolutional neural network is trained to extract features from each local image patch 503 and each full training image 503.

At act 407, a plurality of image patch feature databases are generated. Each image patch feature database corresponds to a different image patch. Additionally, full-image feature database may be generated corresponding to the plurality of full depth images. The databases are indexed in a compact view representation to enable quick search by using efficient metrics. For example, the feature databases indexed for L1-norm or L2-norm metrics. Other metrics may be used.

For example, referring back to FIG. 1, a database for patch 103A will be generated for features of each local image patch 103A from the training images. Likewise, a database for patch 103B will be generated for features of patch 103B, and so on through database 107C generated for features of patch 107C. A database for depth image 101 may also be generated for depth image 101. This results in a set of feature databases in the feature space for a plurality of different poses of the object.

Referring to FIG. 5, an individual index database is constructed for each of the local image patches 503 and the full training images 501. The learned model is used to construct multiple feature databases, where each database corresponds to a certain local image patch from the training images or the full training images. The same machine learnt representation and feature extractor is used for all patches and the full image. For example, the machine learnt representation and feature extractor resizes the input image to a smaller size (e.g., 64×64 compared to full image size 640× 480 and patch size 320×240), allowing the same learnt features to be extracted from different sized of input images. Alternatively, different machine learnt representations and feature extractors may be used for different patch locations. The feature databases are built such that the databases correspond to each patch and the full image, the pose from each patch indexed with the same pose as the full image. The databases are built in a such that each patch location has its own database (e.g., if the image is divided into 3×3 patch areas, 10 databases are built with 9 databases for the different patches and 1 database for the full image). All databases may share the same pool of poses. Alternatively, a single database may be built with each entry in the database containing the location information where the patch was extracted from the original image, with which can be related with the associated pose information.

The indexed feature databases may be used to perform the nearest neighbor search, as discussed above in the testing stage. For example, as depicted in FIG. 5, the indexed feature database may employ a fast library for approximate nearest neighbors (FLANNs). Other indexing methodologies may be used.

Referring back to FIG. 2, the trained model and feature databases are used for estimating a three-dimensional pose of an object. For example, a test image of the object is received. The test image is sampled to generate a plurality of image patches of the test image. A nearest neighbor pose for each of the generated image patches is identified from the plurality image patch databases. Additionally, a nearest neighbor pose may be identified for the full test image from a full-image feature database. A plurality of depth images are rendered based on the nearest neighbor poses. Each of the rendered depth images are aligned with the test image, and the most closely aligned depth image is selected. The pose for the most closely aligned depth image provides or is the pose for the test image. Interpolation from the closest poses may be used for more refined pose estimate.

Figure 6:
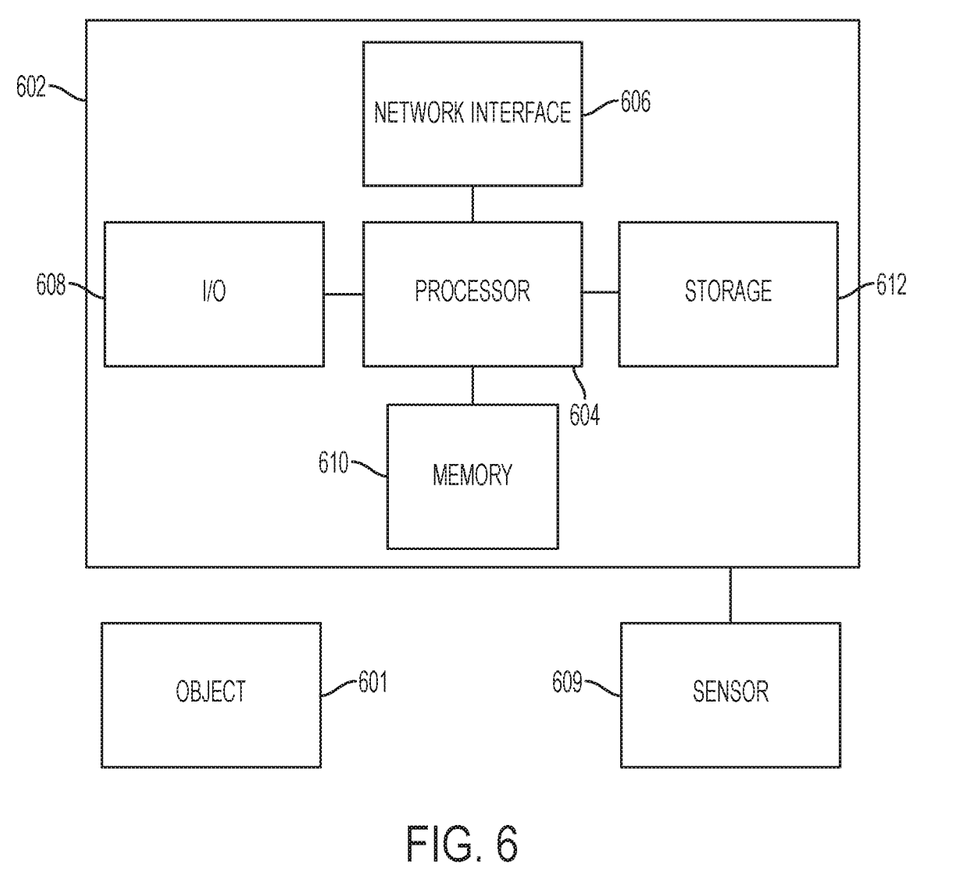
FIG. 6 illustrates an embodiment of a system for estimating a three-dimensional pose of an object.

FIG. 6 illustrates an embodiment of a system for estimating a three-dimensional pose of an object.

For example, the system is implemented on a computer 602. A high-level block diagram of such a computer 602 is illustrated in FIG. 6. Computer 602 includes a processor 604, which controls the overall operation of the computer 602 by executing computer program instructions which define such operation. The computer program instructions may be stored in a storage device 612 (e.g., magnetic disk) and loaded into memory 610 when execution of the computer program instructions is desired. The memory 610 may be local memory as a component of the computer 602, or remote memory accessible over a network, such as a component of a server or cloud system. Thus, the acts of the methods illustrated in FIG. 2 and FIG. 4 may be defined by the computer program instructions stored in the memory 610 and/or storage 612, and controlled by the processor 604 executing the computer program instructions. An image acquisition device 609, such as a three-dimensional scanner, may be connected to the computer 602 to input image data to the computer 602. It is also possible to implement the image acquisition device 609 and the computer 602 as one device. It is further possible that the image acquisition device 609 and the computer 602 communicate wirelessly through a network.

The Image acquisition device 609 is any three-dimensional scanner or other three-dimensional camera. For example, the three-dimensional scanner is a camera with a structured-light sensor, or a structured-light scanner. A structured-light sensor is a scanner that includes a camera and a projector. The projector projects structured light patterns that are captured by the camera. A multi-shot structured light sensor captures multiple images of a projected pattern on the object. The captured images of the pattern are used to generate the three-dimensional depth image of the object.

The computer 602 also includes one or more network interfaces 606 for communicating with other devices via a network, such as the image acquisition device 609. The computer 602 includes other input/output devices 608 that enable user interaction with the computer 602 (e.g., display, keyboard, mouse, speakers, buttons, etc.). Such input/output devices 608 may be used in conjunction with a set of computer programs as an annotation tool to annotate volumes received from the image acquisition device 609. One skilled in the art will recognize that an implementation of an actual computer could contain other components as well, and that FIG. 6 is a high level representation of some of the components of such a computer for illustrative purposes.

For example, the computer 602 may be used to implement a system for estimating a three-dimensional pose of an object. Storage 612 and/or memory 610 is configured to store the feature databases for the sampled image patches generated using training images or image data. Storage 612 and/or memory 610 is further configured to store a full-image feature database generated using the full training images or training data. The individual databases may be stored collected together in a single database.

Processor 604 is configured to receive a depth image of the object captured by image acquisition device 609, such as a sensor of a mobile device. Processor 604 is further configured to generate image patches from the depth image, to identify a nearest neighbor pose for each of the generated image patches from the stored feature databases and to identify a nearest neighbor pose for the received depth image from the stored full-image feature database.

Processor 604 is further configured to estimate a three-dimensional pose of the object from the identified nearest neighbor poses. For example, to estimate the three-dimensional pose of the object, the processor 604 is configured to render a depth image from each of the identified nearest neighbor poses, to align each of the rendered depth images with the received depth image of the object and to select a rendered depth image that is closest to the received depth image. As such, estimating the three-dimensional pose is based on the selected rendered depth image. Processor 604 is also configured to select the rendered depth image closest to the received depth image by generating a difference image for each of the aligned rendered depth images, and to select the aligned rendered depth image corresponding to a difference image with a fewest number of pixels below a depth threshold.

Figure 7:
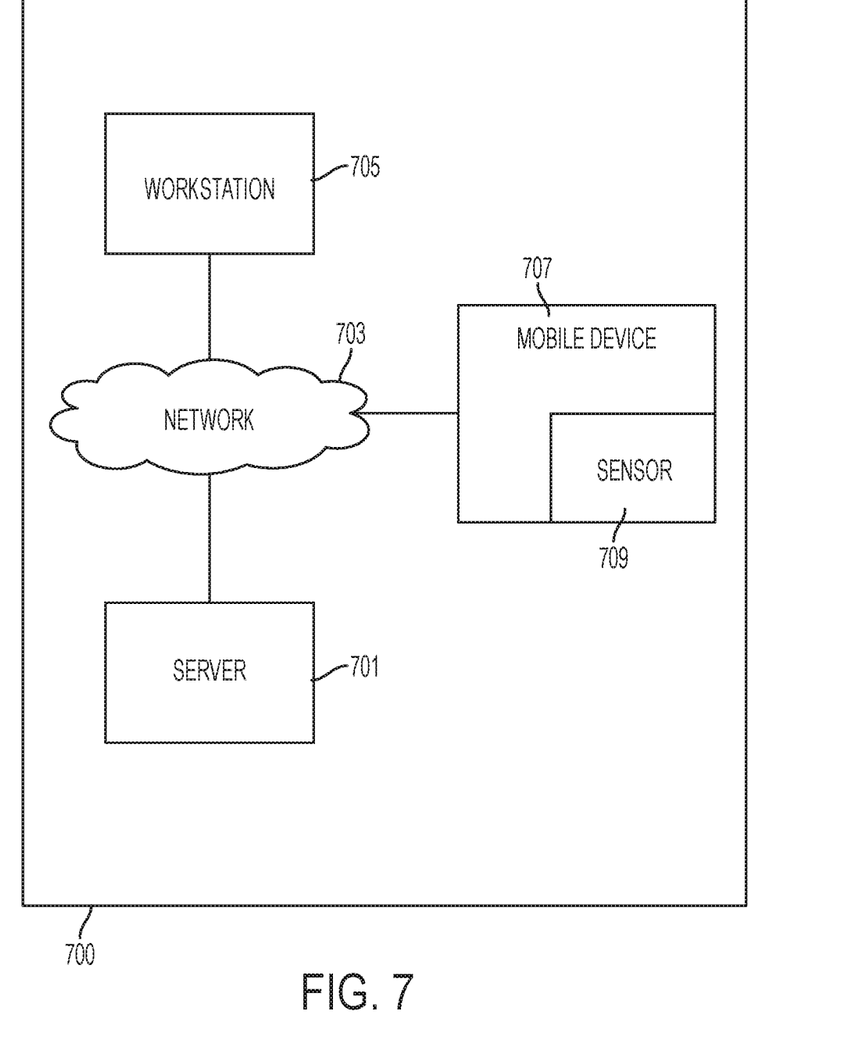
FIG. 7 illustrates another embodiment of a system for estimating a three-dimensional pose of an object.

FIG. 7 illustrates another embodiment of a system for estimating a three-dimensional pose of an object. The system allows for capture of data by a mobile device 707 with pose determination by one or both of a remote workstation 705 or server 701.

The system 700, such as an imaging processing system, may include one or more of a server 701, a network 703, a workstation 705 and a mobile device 707. Additional, different, or fewer components may be provided. For example, additional servers 701, networks 703, workstations 705 and/or mobile devices 707 are used. In another example, the servers 701 and the workstation 705 are directly connected, or implemented on a single computing device. In yet another example, the server 701, the workstation 705 and the mobile device 707 are implemented on a single scanning device. As another example, the workstation 705 is part of the mobile device 707. In yet another embodiment, the mobile 707 performs the image capture and processing without use of the network 703, server 701, or workstation 705.

The mobile device 707 includes sensor 709 and is configured to capture a depth image of an object. The sensor 709 is a three-dimensional scanner configured as a camera with a structured-light sensor, or a structured-light scanner. For example, the depth image may be captured and stored as point cloud data.

The network 703 is a wired or wireless network, or a combination thereof. Network 703 is configured as a local area network (LAN), wide area network (WAN), intranet, Internet or other now known or later developed network configurations. Any network or combination of networks for communicating between the client computer 705, the mobile device 707, the server 701 and other components may be used.

The server 701 and/or workstation 705 is a computer platform having hardware such as one or more central processing units (CPU), a system memory, a random access memory (RAM) and input/output (I/O) interface(s). The server 701 and workstation 705 also includes a graphics processor unit (GPU) to accelerate image rendering. The server 701 and workstation 705 is implemented on one or more server computers connected to network 703. Additional, different or fewer components may be provided. For example, an image processor 709 and/or renderer 711 may be implemented (e.g., hardware and/or software) with one or more of the server 701, workstation 705, another computer or combination thereof.

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

We claim:

1. A method for estimating a three-dimensional pose of an object, the method comprising:
   receiving a depth image of the object;
   sampling the depth image to generate a plurality of image patches of the depth image;
   extracting, using a trained convolutional neural network, features from each of the plurality of image patches;
   searching a plurality of databases, each image patch feature database corresponding to one of the plurality of image patches, for a plurality of nearest neighbor poses, each pose for one of the plurality of image patches;
   generating a full-image feature database corresponding to the received depth image; and
   indexing each pose of each image patch feature database to the same pose in the full-image feature database; and
   estimating, based on the plurality of nearest neighbor poses, the three-dimensional pose of the object.

2. The method of claim 1, wherein a different feature database is searched for each image patch.

3. The method of claim 1, wherein searching the plurality of image patch feature databases comprises applying with L1-norm or L2-norm metrics.

4. The method of claim 1, wherein estimating the three-dimensional pose of the object comprises:
   rendering a depth image from each of the identified nearest neighbor poses;
   aligning each of the rendered depth images with the received depth image of the object; and
   selecting a rendered depth image closest to the received depth image, wherein estimating the three-dimensional pose is based on the selected rendered depth image.

5. The method of claim 4, wherein selecting the rendered depth image closest to the received depth image comprises:
   identifying non-zero pixel regions of the received depth image;
   generating, using the identified non-zero pixel regions, a difference image for each of the aligned rendered depth images; and
   selecting the aligned rendered depth image corresponding to a difference image with a fewest number of pixels below a depth threshold.

6. The method of claim 4, wherein aligning each of the rendered depth images comprises applying a refinement algorithm.

7. The method of claim 1, further comprising:
extracting, using the trained convolutional neural network, features from the depth image; and
identifying, from an image feature database, a nearest neighbor pose for the depth image, wherein estimating the three-dimensional pose of the object is further based on the nearest neighbor pose for the depth image.

8. The method of claim 7, wherein estimating the three-dimensional pose of the object comprises:
rendering a depth image from each of the identified nearest neighbor poses;
aligning each of the rendered depth images with the received depth image of the object; and
selecting a rendered depth image closest to the received depth image, wherein estimating the three-dimensional pose is based on the selected rendered depth image.

9. The method of claim 8, wherein selecting the rendered depth image closest to the received depth image comprises:
identifying non-zero pixel regions of the received depth image;
generating, using the identified non-zero pixel regions, a difference image for each of the aligned rendered depth images; and
selecting the aligned rendered depth image corresponding to a difference image with a fewest number of pixels below a depth threshold.

10. A system for estimating a three-dimensional pose of an object, the system comprising:
a memory configured to store feature databases for image patches, the feature databases generated using training data where each feature database corresponds to one of the image patches; and
a processor configured to:
receive a depth image of the object captured by a sensor of a mobile device; generate image patches from the depth image;
identify, from the stored feature databases, a nearest neighbor pose for each of the generated image patches;
generate a full-image feature database corresponding to the received depth image; and
index each pose of each image patch feature database to the same pose in the full-image feature database and
estimate, from the identified nearest neighbor poses, a three-dimensional pose of the object.

11. The system of claim 10, wherein: the memory is further configured to store an image feature database, the image feature database generated using training data; and the processor is further configured to identify, from the stored image feature database, a nearest neighbor pose for the received depth image and to estimate the three-dimensional pose of the object from the identified nearest neighbor pose for the received depth image.

12. The system of claim 10, wherein, to estimate the three-dimensional pose of the object, the processor is configured to:
render a depth image from each of the identified nearest neighbor poses;
align each of the rendered depth images with the received depth image of the object; and
select a rendered depth image closest to the received depth image, wherein estimating the three-dimensional pose is based on the selected rendered depth image.

13. The system of claim 10, wherein, to select the rendered depth image closest to the received depth image, the processor is configured to:
generate a difference image for each of the aligned rendered depth images; and
select the aligned rendered depth image corresponding to a difference image with a fewest number of pixels below a depth threshold.

14. The method of claim 1, further comprising:
assigning a confidence score for each feature pose in each image patch feature database representing the likelihood that the feature pose fits the pose of the object in the received depth image.

15. The method of claim 1, wherein the confidence score is determined based on a level of noise associated with the image patch corresponding to the feature pose.

* * * * *